United States Patent
Xing et al.

(10) Patent No.: US 10,281,753 B1
(45) Date of Patent: May 7, 2019

(54) LIQUID CRYSTAL DISPLAY CONFIGURED TO HAVE UNIFORM VOLTAGE DROP ACROSS A PIXEL ROW DURING OPERATION AND METHOD THEREOF

(71) Applicant: Wuhan China Star Optoelectronics Technology Co., Ltd., Wuhan, Hubei (CN)

(72) Inventors: Zhenzhou Xing, Guangdong (CN); Qingcheng Zuo, Guangdong (CN)

(73) Assignee: Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 0 days.

(21) Appl. No.: 15/736,638

(22) PCT Filed: Sep. 21, 2017

(86) PCT No.: PCT/CN2017/102636
§ 371 (c)(1),
(2) Date: Jan. 18, 2019

(30) Foreign Application Priority Data

Aug. 21, 2017 (CN) .......................... 2017 1 0728883

(51) Int. Cl.
*G02F 1/133* (2006.01)
*G02F 1/1362* (2006.01)
(Continued)

(52) U.S. Cl.
CPC .... *G02F 1/13306* (2013.01); *G02F 1/136213* (2013.01); *G02F 1/136286* (2013.01);
(Continued)

(58) Field of Classification Search
CPC ........... G02F 1/13306; G02F 1/136213; G02F 1/136286; G09G 3/3677; G09G 2320/0233; G09G 2300/0819; H01L 27/124
See application file for complete search history.

(56) References Cited

U.S. PATENT DOCUMENTS 5,285,302 A 2/1994 Wu
9,140,949 B2 9/2015 Lai et al.
(Continued)

FOREIGN PATENT DOCUMENTS

CN 101315762 A 12/2008
CN 103744209 A 4/2014
(Continued)

*Primary Examiner* — Ryan A Lubit
(74) *Attorney, Agent, or Firm* — Andrew C. Cheng (57) ABSTRACT

The present disclosure discloses a method for improving the display state of a liquid crystal panel, the method including: obtaining a storage capacitor value of a far-end sub-pixel unit, an intermediate sub-pixel unit, and a near-end sub-pixel unit on a gate signal line of an array substrate of the liquid crystal panel; adjusting the storage capacitance value so that the voltage drop caused by the capacitive coupling effect of the far-end sub-pixel unit and the near-end sub-pixel unit is the same as the voltage drop generated by the capacitive coupling effect of the intermediate sub-pixel unit; based on the adjusted storage capacitor values corresponding to adjust the storage capacitance value on the other gate signal lines. Through the above-mentioned way, the brightness of the LCD panel frame is improved or the whitening phenomenon on both sides of the module is improved, improving the display quality of the liquid crystal panel.

14 Claims, 6 Drawing Sheets

(51) Int. Cl.
*G09G 3/36* (2006.01)
*H01L 27/12* (2006.01)

(52) U.S. Cl.
CPC ... *G09G 3/3677* (2013.01); *G09G 2300/0819* (2013.01); *G09G 2320/0233* (2013.01); *H01L 27/124* (2013.01)

(56) References Cited

U.S. PATENT DOCUMENTS

| | | | | |
|---|---|---|---|---|
| 2010/0014041 | A1* | 1/2010 | Park | G02F 1/133707 349/143 |
| 2010/0033645 | A1* | 2/2010 | Nakagawa | G02F 1/136213 349/39 |
| 2014/0132588 | A1* | 5/2014 | Hsu | G09G 3/3614 345/212 |
| 2015/0168758 | A1* | 6/2015 | Nakata | G02F 1/136227 349/43 |
| 2016/0232841 | A1* | 8/2016 | Umeda | G09G 3/3233 |
| 2017/0358605 | A1* | 12/2017 | Choi | H01L 27/124 |

FOREIGN PATENT DOCUMENTS

| | | |
|---|---|---|
| CN | 104536177 A | 4/2015 |
| CN | 105842947 A | 8/2016 |
| CN | 106816137 A | 6/2017 |
| JP | 2004258498 A | 9/2004 |

\* cited by examiner

LIQUID CRYSTAL DISPLAY CONFIGURED TO HAVE UNIFORM VOLTAGE DROP ACROSS A PIXEL ROW DURING OPERATION AND METHOD THEREOF

FIELD OF THE DISCLOSURE

The present disclosure relates to a display technology field, and more particularly to a method for improving the display state of a liquid crystal panel, a liquid crystal panel, and a liquid crystal display.

BACKGROUND OF THE DISCLOSURE

Information society with the increase in the amount of confidence and frequent information exchange, people will be more, more extensive, more often face a variety of display devices. In other words, the display and display technology has become an indispensable part of people's lives. In the 20th century, the image display, the cathode ray tube (CRT) occupies an absolute dominance, with the development of display technology, CRT monitors because of the size is too large and huge consumption of energy consumption and other factors, can not meet the needs of users. The liquid crystal display (Liquid Crystal Display, LCD) technology is just the development of the current trend of information products.

LCD devices are the most mature, most widely used, and are rapidly developing a display device for many flat panel displays. Since 1968 the first piece of liquid crystal display was born, due to continue to have new materials, the emergence of new technology, the new liquid crystal display technology is also emerging, but now only TN, STN, TFD and TFT three kinds of display technology in different grades of liquid crystal display occupy a dominant position, TN, STN, TFD and TFT-type liquid crystal display because of its different driving principle, in the perspective, color, contrast and animation display the quality of the difference between the level of high and low, so that the scope of application of the product classification is significantly different. To the current scope and level of liquid crystal display technology, the active matrix drive technology is based on thin film transistor (TFT) as the mainstream, and more used in mobile terminals and animation, affecting the processing of products.

Figure 1:
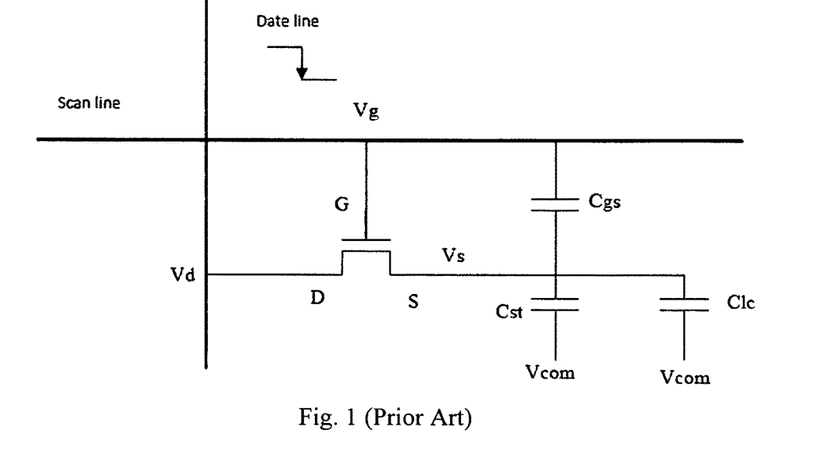
FIG. 1 is a schematic representation of the parasitic capacitance Cgs of the prior art liquid crystal panel.
Figure 2:
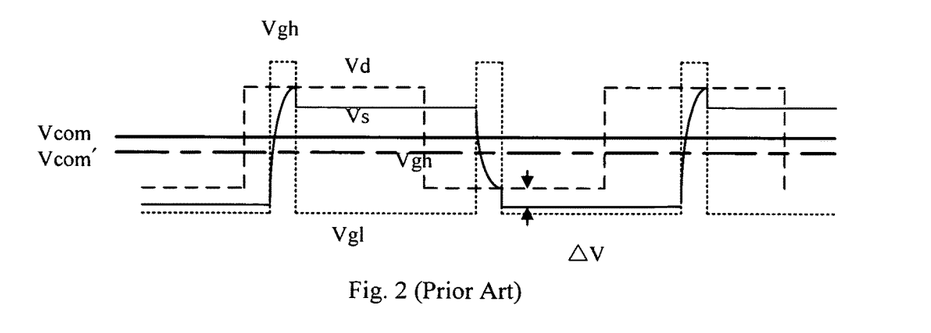
FIG. 2 is a schematic diagram of a Feed-through voltage in a prior art liquid crystal panel.

In general, TFT (Thin Film Transistor) LCD liquid crystal panel in the manufacture and drive process, if there is plastic box plastic pollution, liquid crystal vapor or module drive design defects and other issues, will lead to the frame brightness uneven (Mura) or both sides of the module whitening phenomenon. This phenomenon is mainly due to the LCD liquid crystal panel capacitive coupling effect (Feed-through) caused by, as shown in FIG. 1, TFT-LCD LCD panel parasitic capacitance Cgs, so when the TFT is closed, the pixel charge conservation as shown in FIG. 2, the law of conservation of charge:

When Vg=Vgh, $$Q = (Vgh - Vs) * Cgs + (Vcom - Vs) * (Cst + Clc) \quad (1)$$

When Vg=Vgl, $$Q = (Vgh - Vs') * Cgs + (Vcom - Vs'') * (Cst + Clc) \quad (2)$$

ΔV=Vs−Vs", get feed-through voltage.

$$\Delta V = \frac{(Vgh - Vgl) * Cgs}{Cgs + Clc + Cst} \quad (3)$$

(wherein, Vg—gate voltage line voltage, Vgh and Vgl—sub-pixel gate signal input line voltage, Vs and Vs"—drain voltage, Vcom—common mode voltage, Cst—storage capacitor, Clc—LC filter output voltage;)

Figure 3:
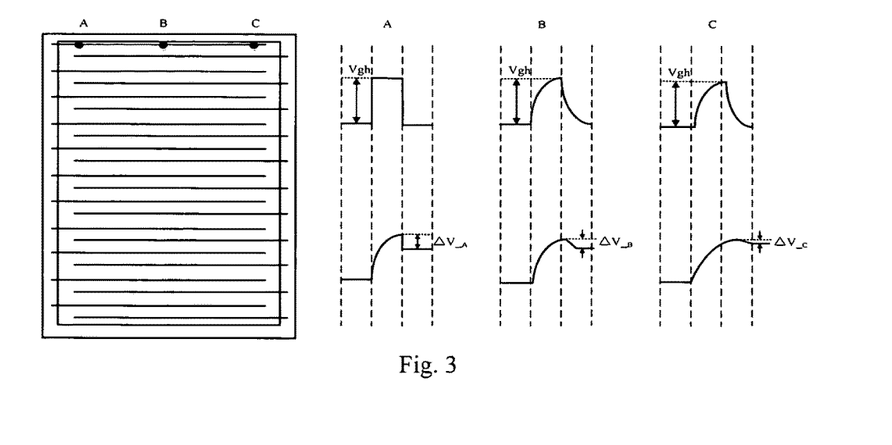
FIG. 3 on the gate signal line on the different point of the feed-through phenomenon diagram.

As shown in FIG. 3, feed-through phenomenon causes the liquid crystal panel on both sides of the white is due to Gate line (gate signal line) signal in the transmission process by the panel RC Loading (capacitance and resistance load), will produce transmission delay distortion phenomenon, resulting in A/B/C three-point feed-through (capacitance coupling effect) voltage ΔV_A/ΔV_B/ΔV_C different size, the performance is ΔV_A>ΔV_B>ΔV_C, that is, the best VCOM (common mode voltage) value of the A/B/C is shown as Best VCOM_A<Best VCOM_B<Best VCOM_C, and because the panel is staggered, the overall VCOM setting of the panel is close to Best VCOM_C, eventually leading to A point than B lit, B point than C lit.

SUMMARY OF THE DISCLOSURE

The technical problem that the present disclosure mainly solves is to provide a method for improving the display state of a liquid crystal panel, a liquid crystal panel, and a liquid crystal display to solve the problem that white light is liable to be generated on both sides of the liquid crystal panel.

In order to solve the above technical problems, the present disclosure provides a method for improving the display state of a liquid crystal panel, the method including: obtaining a storage capacitor value of a far-end sub-pixel unit, an intermediate sub-pixel unit, and a near-end sub-pixel unit on a gate signal line of an array substrate of the liquid crystal panel; adjusting the storage capacitance value of the far-end sub-pixel unit and the near-end sub-pixel unit so that the voltage drop caused by the capacitive coupling effect of the far-end sub-pixel unit and the near-end sub-pixel unit is the same as the voltage drop generated by the capacitive coupling effect of the intermediate sub-pixel unit; based on the adjusted storage capacitor values of the far-end sub-pixel unit and the near-end sub-pixel unit, corresponding to adjust the storage capacitance value of the far-end sub-pixel unit and the near-end sub-pixel unit on the other gate signal lines.

wherein the specific step of adjusting the storage capacitance value of the far-end sub-pixel unit and the near-end sub-pixel unit so that the voltage drop generated by the capacitive coupling effect of the far-end sub-pixel unit and the near-end sub-pixel unit is the same as the voltage drop generated by the capacitive coupling effect of the intermediate sub-pixel unit includes: the storage capacitance of the far-end sub-pixel unit is larger than the storage capacitance of the intermediate sub-pixel unit, the storage capacitance of the intermediate sub-pixel unit is larger than the storage capacitance of the near-end sub-pixel unit, so that the voltage drop generated by the capacitive coupling effect of the far-end sub-pixel unit and the near-end sub-pixel unit is the same as the voltage drop generated by the capacitive coupling effect of the intermediate sub-pixel unit.

Wherein the specific step of adjusting the storage capacitance value of the far-end sub-pixel unit and the near-end sub-pixel unit so that the voltage drop generated by the capacitive coupling effect of the far-end sub-pixel unit and the near-end sub-pixel unit is the same as the voltage drop generated by the capacitive coupling effect of the intermediate sub-pixel unit includes: the dielectric constant of the storage capacitor of the far-end sub-pixel unit is smaller than the dielectric constant of the intermediate sub-pixel unit, the dielectric constant of the intermediate sub-pixel unit is smaller than the dielectric constant of the near-end sub-pixel unit, so that the voltage drop generated by the capacitive coupling effect of the far-end sub-pixel unit and the near-end sub-pixel unit is the same as the voltage drop generated by the capacitive coupling effect of the intermediate sub-pixel unit.

Wherein, the far-end sub-pixel unit, the intermediate sub-pixel unit, and the near-end sub-pixel unit are divided into a far-end sub-pixel unit area, an intermediate sub-pixel unit area, and a near-end sub-pixel unit area along the same gate signal line.

Wherein, the specific step of obtaining a storage capacitor value of a far-end sub-pixel unit, an intermediate sub-pixel unit, and a near-end sub-pixel unit on a gate signal line of an array substrate of the liquid crystal panel includes: obtaining the average storage capacitance value of the far-end sub-pixel unit area, the intermediate sub-pixel unit area, and the near-end sub-pixel unit area on the gate signal line of the array substrate of the liquid crystal panel.

Further, the method of improving the display state of the liquid crystal panel further includes reducing the number of OP amplifiers in the output buffer stages on both sides of the liquid crystal panel source line so that the luminance on both sides of the liquid crystal panel coincides with the brightness in the middle.

Optionally, the method of improving the display state of the LCD panel also includes increasing the area of the OP amplifier in the output buffer stage of the source line so that the brightness on both sides of the LCD panel coincides with the brightness of the middle.

Optionally, the method of improving the display state of the liquid crystal panel also includes increasing the width of the black matrix film so that the brightness on both sides of the liquid crystal panel coincides with the brightness of the middle.

In order to solve the above technical problems, the present disclosure provides a liquid crystal panel including: a far-end sub-pixel unit, the far-end sub-pixel unit being provided with a storage capacitor; an intermediate sub-pixel unit, the intermediate sub-pixel unit being provided with a storage capacitor; a near-end sub-pixel unit, the near-end sub-pixel unit being provided with a storage capacitor; the voltage drop generated by the capacitive coupling effect of the far-end sub-pixel unit and the near-end sub-pixel unit is the same as the voltage drop generated by the capacitive coupling effect of the intermediate sub-pixel unit.

In order to solve the above-mentioned technical problems, the present disclosure also provides a liquid crystal display including a liquid crystal panel, and the liquid crystal panel is produced by any of the methods described above for improving the display state of a liquid crystal panel.

Wherein the number of OP amplifiers in the output buffer stage on both sides of the liquid crystal panel source line is smaller than the number of OP amplifiers in the intermediate output buffer stage.

Wherein the area of the OP amplifier in the output buffer stage of the source line is larger than the area of the OP amplifier in both the output buffer stages.

The disclosure has the advantages that: in contrast to the prior art, the present disclosure makes the voltage drop generated by the capacitive coupling effect of the far-end sub-pixel unit and the near-end sub-pixel unit the same as the voltage drop generated by the capacitive coupling effect of the intermediate sub-pixel unit by changing the storage capacitance of the sub-pixel unit, effectively improve the brightness of the LCD panel box uneven or both sides of the module whitening phenomenon, to provide users with a better experience.

DETAILED DESCRIPTION OF PREFERRED EMBODIMENTS

The present disclosure will now be described in detail with reference to the accompanying drawings and examples.

Figure 4:
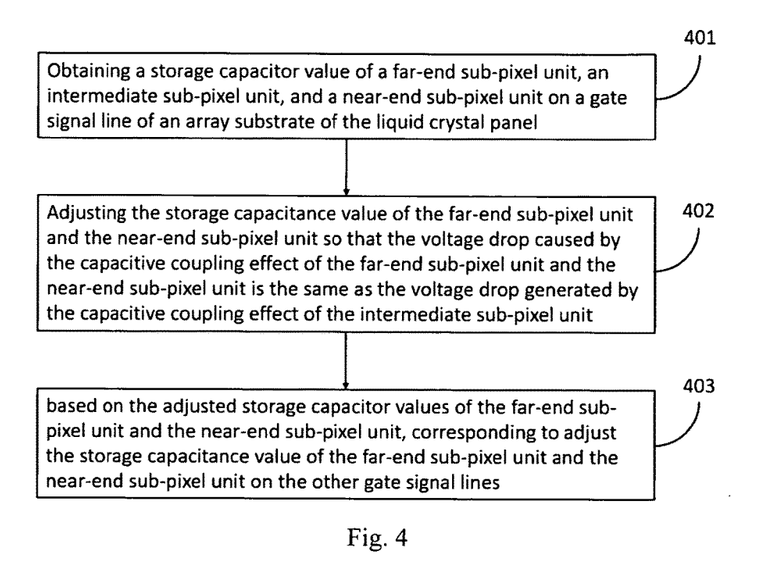
FIG. 4 is a flow diagram of an embodiment of a method for improving the display state of a liquid crystal panel of the present disclosure.

Refer to FIG. 4, FIG. 4 is a flow diagram of an embodiment of a method for improving the display state of a liquid crystal panel of the present disclosure, the method for improving the liquid crystal panel of the present embodiment includes the steps of:

401: Obtaining a storage capacitor value of a far-end sub-pixel unit, an intermediate sub-pixel unit, and a near-end sub-pixel unit on a gate signal line of an array substrate of the liquid crystal panel;

In the present embodiment, the far-end sub-pixel unit, the intermediate sub-pixel unit, and the near-side sub-pixel unit are divided into the far-end sub-pixel unit region, the intermediate sub-pixel cell region, and the near-end sub-pixel cell region along the same gate signal line. The specific step of obtaining a storage capacitor value of a far-end sub-pixel unit, an intermediate sub-pixel unit, and a near-end sub-pixel unit on a gate signal line of an array substrate of the liquid crystal panel includes: obtaining the average storage capacitance value of the far-end sub-pixel cell region, the intermediate sub-pixel cell region, and the near-end sub-pixel cell region on the gate signal line of the array substrate of the liquid crystal panel.

Wherein the liquid crystal panel is an active matrix driving type liquid crystal panel. Specifically, each sub-pixel unit controls the light transmittance through a transistor, and connects the same gate signal line sub-pixel unit, after power is applied, the sub-pixel unit changes to form a specific color, and an image is formed based on the screen image information.

Wherein the sub-pixel storage capacitor is a capacitor in the active matrix display in parallel with the pixel to maintain the voltage of each pixel signal; in addition, the capacitance refers to the inductance, resistance, chip pins and other high-frequency performance in the case of capacitance characteristics.

402: Adjusting the storage capacitance value of the far-end sub-pixel unit and the near-end sub-pixel unit so that the voltage drop caused by the capacitive coupling effect of the far-end sub-pixel unit and the near-end sub-pixel unit is the same as the voltage drop generated by the capacitive coupling effect of the intermediate sub-pixel unit.

In a specific embodiment, the stored value of the acquired far-end sub-pixel unit, the intermediate sub-pixel unit, and the near-end sub-pixel unit is the same in the initial state. Therefore, the step of adjusting the storage capacitance value of the far-end sub-pixel unit and the near-end sub-pixel unit specifically means that the storage capacitance of the far-end sub-pixel unit is larger than the storage capacitance of the intermediate sub-pixel unit, the storage capacitance of the intermediate sub-pixel unit is larger than the storage capacitance of the near-end sub-pixel unit, the voltage drop generated by the capacitive coupling effect of the far-end sub-pixel unit and the near-end sub-pixel unit is the same as the voltage drop generated by the capacitive coupling effect of the intermediate sub-pixel unit.

Wherein the capacitive coupling effect is due to the change of the other voltage on the panel, affecting the correctness of the display electrode voltage, from the near-end to the distal signal distortion will become more and more serious, however, since the panel drive is driven alternately around the gate, the luminance values of the sub-pixel units on both sides are uneven.

403: based on the adjusted storage capacitor values of the far-end sub-pixel unit and the near-end sub-pixel unit, corresponding to adjust the storage capacitance value of the far-end sub-pixel unit and the near-end sub-pixel unit on the other gate signal lines.

In the present embodiment, the storage capacitor values of the acquired far-end sub-pixel unit, the intermediate sub-pixel unit, and the near-end sub-pixel unit are the same in the initial state. Therefore, when the storage capacitance value of the far-end sub-pixel unit, the intermediate sub-pixel unit, and the near-end sub-pixel unit on one of the gate signal lines is adjusted, the storage capacitance value of the far-end sub-pixel unit, the intermediate sub-pixel unit, and the near-end sub-pixel unit on the other gate signal lines can be adjusted accordingly.

Figure 5:
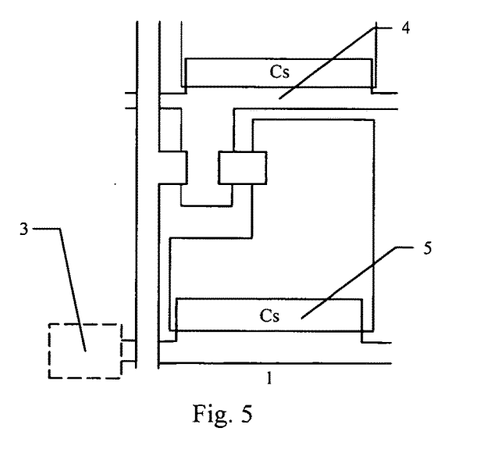
FIG. 5 is a schematic representation of a memory structure of an embodiment of the present disclosure.

In a particular embodiment, as shown in FIG. 5, the storage capacitor is a Common 1 (Cs on common) architecture, there is an additional common line 3 added to the Common 1 architecture. Since the storage capacitor is similar to the general capacitance, the storage capacitor of the far-end sub-pixel unit on the same gate signal line 4, the storage capacitance of the intermediate sub-pixel unit, and the storage capacitance of the near-end sub-pixel unit are directly obtained, and then adjusts the dielectric constant of the storage capacitor of the far-end sub-pixel unit and the near-end sub-pixel unit on the other gate signal lines, increases the dielectric constant of the near-end storage capacitor, and reduces the dielectric constant of the far-end storage capacitor. That is, the storage capacitor values of the far-end sub-pixel unit and the near-end sub-pixel unit are adjusted so that the voltage drop generated by the capacitive coupling effect of the far-end sub-pixel unit and the near-end sub-pixel unit is the same as the voltage drop generated by the capacitive coupling effect of the intermediate sub-pixel unit. Adjusting the dielectric constants of the far-end sub-pixel unit and the near-end sub-pixel unit on the other gate signal lines according to the dielectric constants of the adjusted far-end sub-pixel unit and the near-end sub-pixel unit, so that the voltage drop generated by the far-end sub-pixel unit and the near-end sub-pixel cell capacitive coupling effect on the other gate signal lines is the same.

Figure 6:
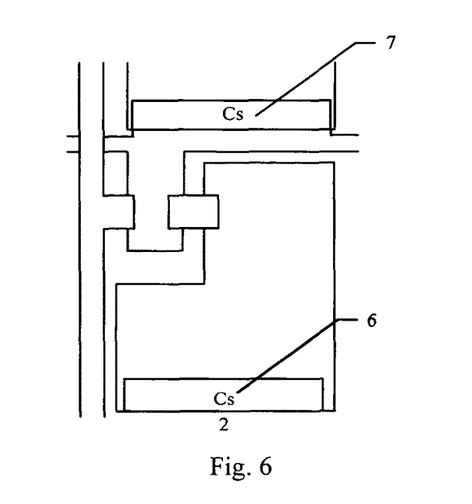
FIG. 6 is a schematic diagram of a storage capacitor for a gate-level architecture according to an embodiment of the present disclosure.

In another specific embodiment, the storage capacitor is the gate 2 (Cs on gate) architecture, as shown in FIG. 6. Its storage capacitor 6 is affected by the gate signal line 7 and the display electrode, and the amount of electricity stored in the process of displaying the image fluctuates, but the fluctuation time contrast is shorter than the display image update time, so only need to obtain the storage capacitor over a period of time the average, through the average size, increase the proximal storage capacitor dielectric constant, reduce the far-end storage capacitor dielectric constant. That is, the storage capacitor values of the far-end sub-pixel unit and the near-end sub-pixel unit are adjusted so that the voltage drop generated by the capacitive coupling effect of the far-end sub-pixel unit and the near-end sub-pixel unit is the same as the voltage drop generated by the capacitive coupling effect of the intermediate sub-pixel unit. Adjusting the dielectric constants of the far-end sub-pixel unit and the near-end sub-pixel unit on the other gate signal lines according to the dielectric constants of the adjusted far-end sub-pixel unit and the near-end sub-pixel unit, so that the voltage drop generated by the far-end sub-pixel unit and the near-end sub-pixel cell capacitive coupling effect on the other gate signal lines is the same.

Figure 7:
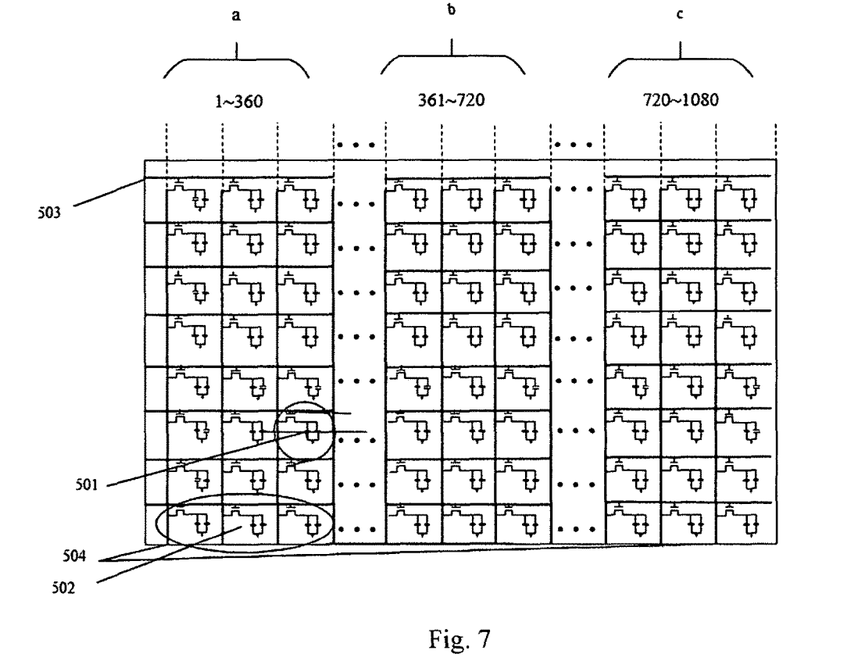
FIG. 7 is an equivalent circuit diagram of an embodiment of the liquid crystal panel of the present disclosure.

Hereinafter, the specific application of the above method is described in detail with a specific liquid crystal panel. Refer to FIG. 7, FIG. 7 is an equivalent circuit diagram of an embodiment of the liquid crystal panel of the present disclosure, including: a plurality of sub-pixel units 501, a gate signal line 503 corresponding to each sub-pixel unit, a common electrode line, and a data line 504 corresponding to each sub-pixel unit. The gate signal line 503 is connected to the gate drive, and the data line 504 is driven by an external source. The capacitance of each of the TFTs in parallel with the Clc (filter capacitor) and the Cst (storage capacitor) in this embodiment represents a display point 501. Herein, one pixel 502 is composed of three RGB three primary sub-pixel units. To a 1080*900 resolution TFT-LCD, for example, a total of 1080*900*3 points 501 combination.

Specifically, the gate driver sends out the waveform data signal, and the TFT of each row is turned on. The display points of the same row are charged to the respective required voltages according to the waveform data signal through the source driver to display different gray levels. When this line is charged, the gate driver will turn off the voltage, and then open the next row of the gate driver to the voltage in this order, when the last line of the display point, then re-start from the first line of charge, so repeated.

In a particular embodiment, the FHD (1080RGB*1920) resolution is taken as an example, the liquid crystal panel includes a far-end sub-pixel unit c, a storage capacitor is provided on the far-end sub-pixel unit c; an intermediate sub-pixel unit b, and an intermediate sub-pixel unit b, and a near-end sub-pixel unit a and a proximal sub-pixel unit a is provided with a storage capacitor. The following describes in detail the process of improving its display:

First obtaining the storage capacitance value of the far-end sub-pixel unit c, the intermediate sub-pixel unit b, and the near-end sub-pixel unit a on the same gate signal line on the array substrate of the liquid crystal panel; wherein the first 1 to 360 sub-pixel units are the near-end sub-pixel regions, the 361 to 720 column sub-pixel units are intermediate sub-pixel regions, and the 721 to 1080 column sub-pixel units are the far-end sub-pixel regions. It is assumed that one column sub-pixel unit on the same gate signal line is selected as the near-end pixel unit, the 1080-column sub-pixel unit is the far-end sub-pixel unit, selecting the selected proximal and distal midpoint as the intermediate sub-pixel unit to be selected, that is, 540 columns as the intermediate sub-pixel unit, in order to reduce the feed-through phenomenon led to white side of the LCD panel whitening phenomenon, adjusting the storage capacitance values of the far-end sub-pixel unit c and the near-end sub-pixel unit a so that the voltage drop generated by the capacitive coupling effect of the far-end sub-pixel unit c and the near-end sub-pixel unit a is the same as the voltage drop generated by the capacitive coupling effect of the intermediate sub-pixel unit b, even if the three feed-through voltages are the same.

In other embodiments, the acquired far-end sub-pixel unit, the intermediate sub-pixel unit, and the near-end sub-pixel unit have the same storage capacitance value in the initial state. Therefore, the step of adjusting the storage capacitance value of the far-end sub-pixel unit and the near-end sub-pixel unit specifically means that the storage capacitor of the far-end sub-pixel unit is replaced with a capacitor having a larger storage capacitance value, the storage capacitor of the near terminal pixel unit is replaced with a capacitor having a smaller storage capacitance so that the voltage drop generated by the capacitive coupling effect of the far-end sub-pixel unit and the near-end sub-pixel unit is the same as the voltage drop generated by the capacitive coupling effect of the intermediate sub-pixel unit. That is, after the improvement is completed, the storage capacitance value of the storage capacitor on the far-end sub-pixel unit of the liquid crystal panel is larger than the storage capacitance value of the storage capacitor on the intermediate sub-pixel unit, the storage capacitance value of the storage capacitor on the intermediate sub-pixel unit is larger than the storage capacitance value of the storage capacitor on the near-end sub-pixel unit.

Optionally, in other embodiments, in order to simplify the method of improving the liquid crystal panel, the sub-pixel unit on the gate signal can be divided into three regions according to the number, which are the far-end sub-pixel cell region, the intermediate sub-pixel cell region, and the near-end sub-pixel cell region, respectively; the far-end sub-pixel unit and the near-end sub-pixel unit feed-through voltage are adjusted according to the storage capacitance value of the intermediate region of 361 to 720 as an average value (or a small number of subpixels as a reference). In this case, the voltage drop generated by the capacitive coupling effect of the near-end sub-pixel unit region in the far-end sub-pixel cell region is the same as the voltage drop generated by the capacitive coupling effect of the intermediate sub-pixel cell region.

In contrast to the prior art, the present disclosure makes the voltage drop generated by the capacitive coupling effect of the far-end sub-pixel unit and the near-end sub-pixel unit the same as the voltage drop generated by the capacitive coupling effect of the intermediate sub-pixel unit by changing the storage capacitance of the sub-pixel unit, effectively improve the brightness of the LCD panel box uneven or both sides of the module whitening phenomenon, to provide users with a better experience LCD panel.

In other embodiments, the liquid crystal panel display effect can also be adjusted by changing the driving force of the source driver of the liquid crystal panel or the gray scale voltage input from the source line.

Figure 8:
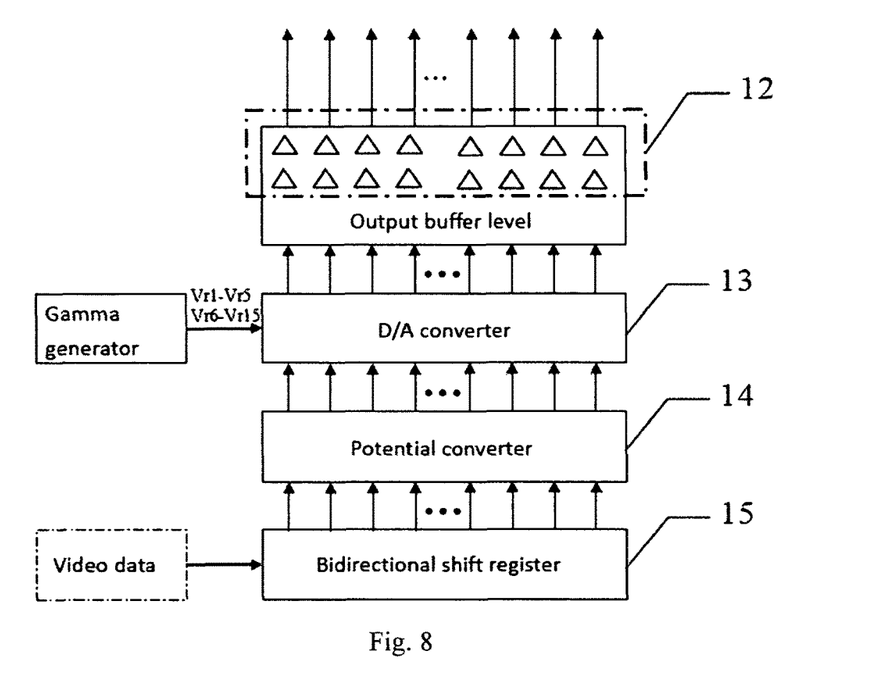
FIG. 8 is a schematic diagram of a prior art source driver processing video signal.

Specifically, as shown in FIG. 8, the basic flow of the source driver processing the video signal is as follows, the video data is sequentially buffered by the bidirectional shift register 15 and then input to the potential converter 14 to raise the voltage of the video signal, and the boosted voltage opens the corresponding gate in the D/A converter 13, the γ reference voltages Vr1 to Vr5 and Vr6 to Vr15 generated in the output buffer stage 12 are input to the output buffer stage via the field effect transistor, and finally the source signal is supplied to the data line in the panel with the gate driver signal, and finally displayed on the LCD panel.

Figure 9:
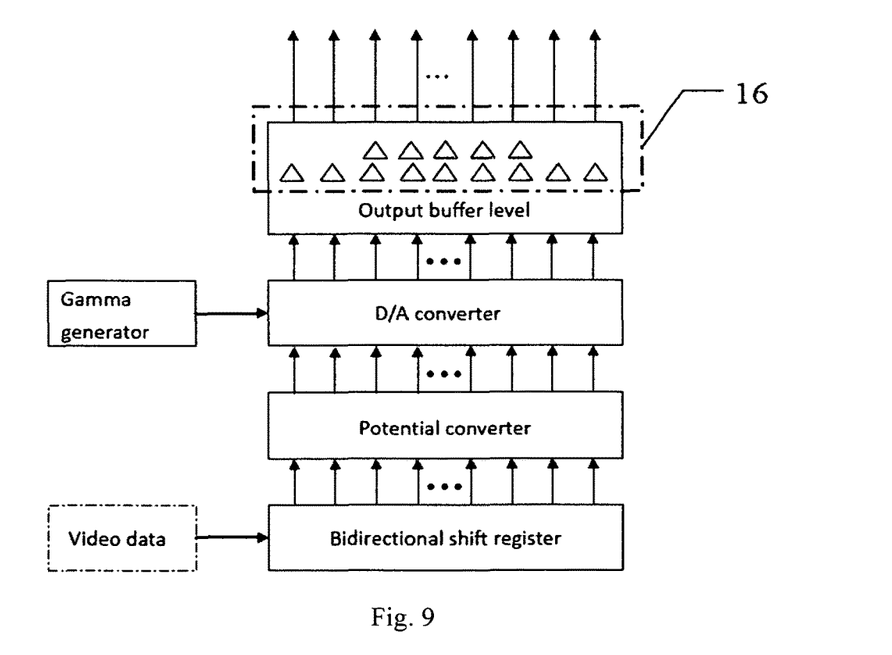
FIG. 9 is a schematic diagram of a source driver structure of an embodiment of the present disclosure.

In a specific embodiment, as shown in FIG. 9, the gray scale voltage inputted on both sides of the liquid crystal panel is reduced so that the luminance on both sides of the liquid crystal panel coincides with the brightness in the middle. Specifically, the number of OP amplifiers in the two-side source line output buffer stage 16 is reduced, and the driving capability on both sides of the liquid crystal panel is reduced, and the luminance on both sides of the liquid crystal panel is reduced to achieve uniformity.

Figure 10:
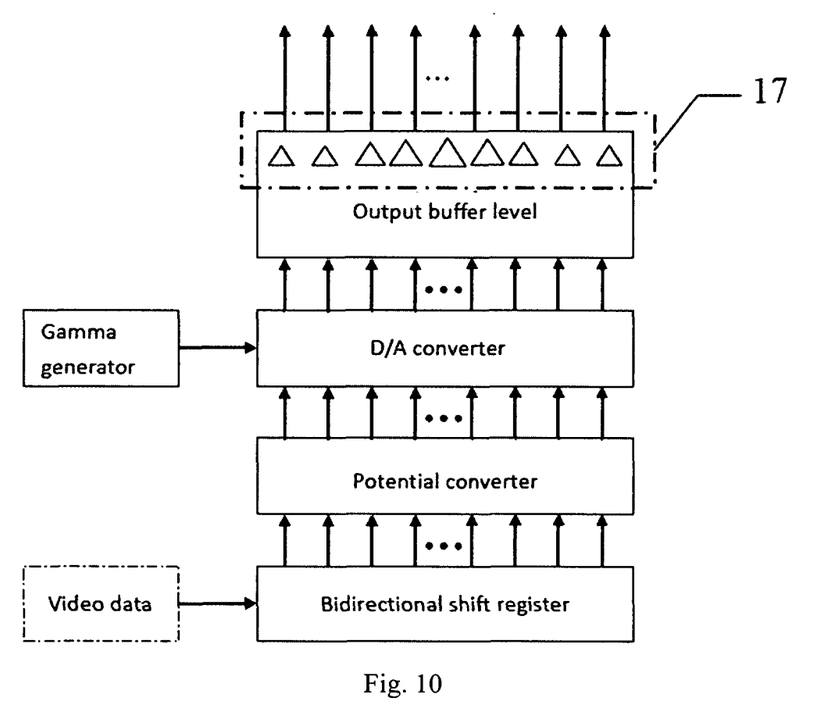
FIG. 10 is a schematic diagram of a source driver structure of another embodiment of the present disclosure.

In another embodiment, as shown in FIG. 10, the area of the OP amplifier in the buffer stage 17 is increased by increasing the intermediate portion of the source line to enhance the driving capability of the intermediate portion of the panel to achieve uniform display. In other embodiments, it is also possible to reduce the area in the OP amplifier in the output buffer stage 17 on both sides of the source line to reduce the drive capability on both sides of the panel to achieve uniform display.

Figure 11:
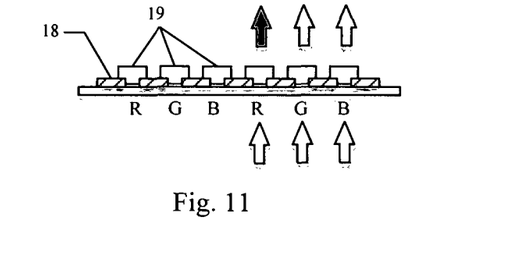
FIG. 11 is a schematic diagram of a black matrix structure according to an embodiment of the present disclosure.

The storage capacitor values of the far-end sub-pixel unit and the near-end sub-pixel unit on the other gate signal lines are adjusted according to the stored capacitance values of the adjusted far-end sub-pixel unit and the near-end sub-pixel unit, if the edge of the LCD panel found no significant improvement in the phenomenon, and adjust the current LCD panel on both sides of the source driver has not improved significantly, indicating that the face of the LCD panel black matrix position accuracy differences, the black matrix film covering width is appropriately increased according to the edge state of the current liquid crystal panel, and the luminance on both sides of the liquid crystal panel is made to coincide with the middle. Specifically, as shown in FIG. 11, the black matrix 18 is located at the bottom of the sub-pixel unit 19 for preventing light leakage between sub-pixels. At this time, the width of the black matrix 18 is narrow, the sub-pixel unit 19 interacts, the liquid crystal panel displays an abnormality, and the background light of the edge region passes directly through the region of the sub-pixel unit 19 to find the whitening area on both sides of the liquid crystal panel, the width of the corresponding black matrix 18 is increased so that the black matrix 18 covers the edge region of the sub-pixel unit 19.

Alternatively, in the above embodiment, the liquid crystal panel is an active matrix drive type liquid crystal panel.

Any of the liquid crystal panels described above can be applied to a device having a display function such as a liquid crystal display, a mobile phone, a smart watch, or the like.

Figure 12:
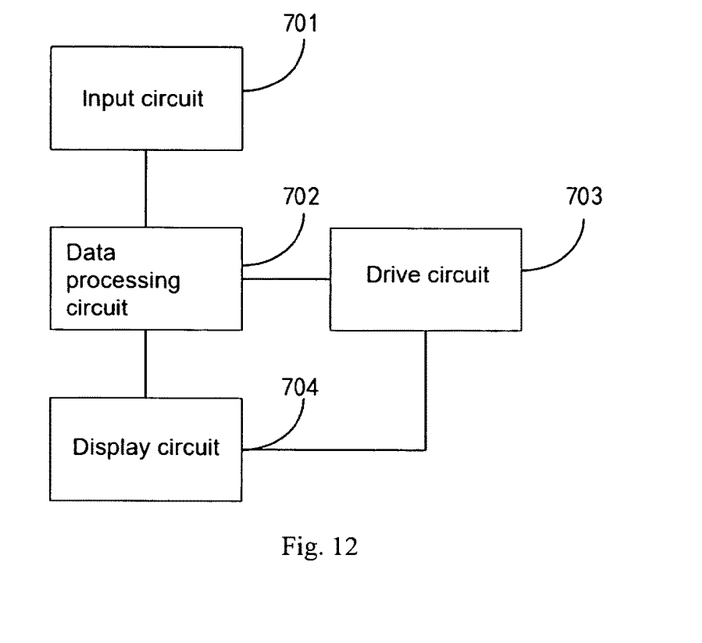
FIG. 12 is an electrical connection diagram of an embodiment of the liquid crystal panel of the present disclosure.

FIG. 12 is a schematic illustration of an electrical connection of an embodiment of the liquid crystal panel of the present disclosure, the liquid crystal panel includes a data input circuit 701, a data processing circuit 702, a driving circuit 703, and a display circuit 704, wherein the input circuit 701, the drive circuit 703, and the display circuit 704 are connected to the data processing circuit 702, respectively, and the display circuit 704 is connected to the drive circuit 703, the data input circuit 701 is used to acquire the image feature data to be displayed, convert the image data into an input electrical signal, the data processing 702 circuit for converting the input electrical signal into respective sub-pixel corresponding gate signals; acquiring the image feature data of the liquid crystal panel based on the gate signal and the input electrical signal; and outputs an image based on the characteristic data and the driving current of the display panel.

Figure 13:
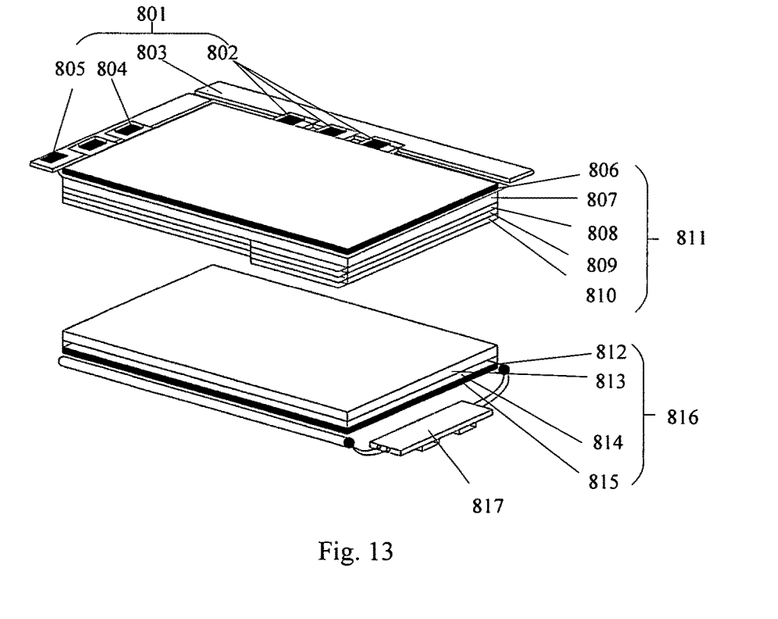
FIG. 13 is a schematic structural view of an embodiment of the liquid crystal panel according to the present disclosure.

As shown in FIG. 13, FIG. 13 is a schematic structural view of an embodiment of the liquid crystal panel of the present disclosure, mainly includes a driving circuit 801, a liquid crystal panel 811, a backlight 816, and a high voltage plate 817; wherein the driving circuit 801 includes: a column driving data IC 802, a PCB board 803, a row driving IC 804, and a video signal power supply 805; the liquid crystal panel 811 includes a front polarizing plate front glass plate 806, an RGB color filter 807, a liquid crystal layer 808, a TFT matrix 809, and a post-polarizing plate front glass plate 810; the backlight 816 includes a backlight 812, a prism and a diffusion surface 813, a light guide layer 814, and a mirror 815.

The main board circuit outside the display panel is connected with the liquid crystal panel interface through a cable. The display panel is further provided with a PCB board 817 on which a liquid crystal panel driving circuit 801 is provided, mainly provided with video signal power supply 805, a row driving IC 804, a column driving data IC, and the like, as shown in FIG. 8. By the motherboard circuit to the data and the clock signal, the screen IC circuit processing, the separation of the line drive signal and column drive signal, and then sent to the LCD screen row and column electrodes, driving the LCD screen shows the image.

In contrast to the prior art, the present disclosure makes the voltage drop generated by the capacitive coupling effect of the far-end sub-pixel unit and the near-end sub-pixel unit the same as the voltage drop generated by the capacitive coupling effect of the intermediate sub-pixel unit by changing the storage capacitance of the sub-pixel unit, effectively improve the brightness of the LCD panel box uneven or both sides of the module whitening phenomenon, to provide users with a better experience.

The foregoing is merely an embodiment of the present disclosure and is not intended to limit the scope of the disclosure, any equivalent or equivalent process transformation made using the present specification and the accompanying drawings, either directly or indirectly, in other related technical fields, is likewise included within the scope of the patent protection of the present disclosure.

What is claimed is:

1. A method of improving the display state of a liquid crystal display panel from an initial configuration to an adjusted configuration, wherein the method comprises:
   obtaining a storage capacitor value of a far-end sub-pixel unit, an intermediate sub-pixel unit, and a near-end sub-pixel unit on a first gate signal line of an array substrate of the liquid crystal panel;
   adjusting, from the initial configuration, the storage capacitance value of the far-end sub-pixel unit and the near-end sub-pixel unit by changing the dielectric constants of the storage capacitors thereof to be different from one another so that the voltage drop caused by the capacitive coupling effect of the far-end sub-pixel unit and the near-end sub-pixel unit is the same as the voltage drop generated by the capacitive coupling effect of the intermediate sub-pixel unit;
   based on the adjusted storage capacitor values of the far-end sub-pixel unit and the near-end sub-pixel unit, adjusting the storage capacitance value of the far-end sub-pixel unit and the near-end sub-pixel unit on other gate signal lines to obtain the adjusted configuration.

2. The method for improving the display state of the liquid crystal panel according to claim 1, wherein the dielectric constant of the storage capacitor of the far-end sub-pixel unit is adjusted to be smaller than the dielectric constant of the intermediate sub-pixel unit, and the dielectric constant of the intermediate sub-pixel unit is adjusted to be smaller than the dielectric constant of the near-end sub-pixel unit.

3. The method for improving the display state of the liquid crystal panel according to claim 1, wherein, the far-end sub-pixel unit, the intermediate sub-pixel unit, and the near-end sub-pixel unit are divided into a far-end sub-pixel unit area, an intermediate sub-pixel unit area, and a near-end sub-pixel unit area along the same gate signal line.

4. The method for improving the display state of the liquid crystal panel according to claim 1, wherein, the specific step of obtaining a storage capacitor value of a far-end sub-pixel unit, an intermediate sub-pixel unit, and a near-end sub-pixel unit on a gate signal line of an array substrate of the liquid crystal panel comprises: obtaining the average storage capacitance value of the far-end sub-pixel unit area, the intermediate sub-pixel unit area, and the near-end sub-pixel unit area on the gate signal line of the array substrate of the liquid crystal panel.

5. The method for improving the display state of the liquid crystal panel according to claim 1, further comprising reducing, from the initial configuration, the number of OP amplifiers in the output buffer stage on both sides of the liquid crystal panel source line so that the luminance on both sides of the liquid crystal panel coincides with the brightness of the middle.

6. The method for improving the display state of the liquid crystal panel according to claim 1, further comprising increasing, from the initial configuration, the area of the OP amplifier in the output buffer stage of the source line so that the luminance on both sides of the liquid crystal panel coincides with the brightness in the middle.

7. The method for improving the display state of the liquid crystal panel according to claim 1, further comprising increasing, from the initial configuration, the coverage width of the black matrix film so that the luminance on both sides of the liquid crystal panel coincides with the brightness in the middle.

8. A liquid crystal panel, comprising:
   a far-end sub-pixel unit, the far-end sub-pixel unit being provided with a storage capacitor;
   an intermediate sub-pixel unit, the intermediate sub-pixel unit being provided with a storage capacitor;
   a near-end sub-pixel unit, the near-end sub-pixel unit being provided with a storage capacitor;
   wherein the storage capacitors of the far-end sub-pixel unit, the intermediate sub-pixel unit, and the near-end sub-pixel unit are configured to have different dielectric constants so that the voltage drop generated by the capacitive coupling effect of the far-end sub-pixel unit and the near-end sub-pixel unit is the same as the voltage drop generated by the capacitive coupling effect of the intermediate sub-pixel unit.

9. The liquid crystal display device according to claim 8, wherein the dielectric constant of the storage capacitor of the far-end sub-pixel unit is smaller than the dielectric constant of the intermediate sub-pixel unit, and the dielectric constant of the intermediate sub-pixel unit is smaller than the dielectric constant of the near-end sub-pixel unit.

10. The liquid crystal display device according to claim 8, wherein, the far-end sub-pixel unit, the intermediate sub-pixel unit, and the near-end sub-pixel unit are divided into a far-end sub-pixel unit area, an intermediate sub-pixel unit area, and a near-end sub-pixel unit area along the same gate signal line.

11. The liquid crystal display device according to claim 8, wherein, after adjustment, the storage capacitance of the far-end sub-pixel unit area is larger than the storage capacitance of the intermediate sub-pixel unit area, the storage capacitance of the intermediate sub-pixel unit area is larger than the storage capacitance of the near-end sub-pixel unit area, so that the voltage drop generated by the capacitive coupling effect of the far-end sub-pixel unit area and the near-end sub-pixel unit area is the same as the voltage drop generated by the capacitive coupling effect of the intermediate sub-pixel unit area.

12. The liquid crystal display device according to claim 8, wherein, the number of OP amplifiers in the output buffer stage on both sides of the liquid crystal panel source line is smaller than the number of OP amplifiers in the intermediate output buffer stage.

13. The liquid crystal display device according to claim 8, wherein, the area of the OP amplifier in the output buffer stage in the middle of the source line is larger than the area of the OP amplifier in the output buffer stage on both sides of the source line.

14. The liquid crystal display device according to claim 8, wherein a width of a black matrix film is configured so that the brightness on both sides of the liquid crystal panel coincides with the brightness of the middle.

* * * * *